United States Patent
Li et al.

(10) Patent No.: US 10,381,534 B2
(45) Date of Patent: Aug. 13, 2019

(54) LIGHT EMITTING DEVICE INCLUDING A LEAD FRAME AND AN INSULATING MATERIAL

(71) Applicant: LUMILEDS LLC, San Jose, CA (US)

(72) Inventors: Shu Li, San Jose, CA (US); Thuy Vu, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 15/652,603

(22) Filed: Jul. 18, 2017

(65) Prior Publication Data

US 2019/0027661 A1    Jan. 24, 2019

(51) Int. Cl.
   *H01L 33/60*    (2010.01)
   *H01L 33/62*    (2010.01)
   *H01L 33/52*    (2010.01)
   *H01L 33/00*    (2010.01)
   *H01L 33/50*    (2010.01)

(52) U.S. Cl.
   CPC ............ *H01L 33/60* (2013.01); *H01L 33/005* (2013.01); *H01L 33/50* (2013.01); *H01L 33/52* (2013.01); *H01L 33/62* (2013.01); *H01L 2933/005* (2013.01); *H01L 2933/0066* (2013.01)

(58) Field of Classification Search
   CPC ....... H01L 33/60; H01L 33/005; H01L 33/50; H01L 33/52; H01L 33/62; H01L 2933/005; H01L 2933/0066
   See application file for complete search history.

(56) References Cited

U.S. PATENT DOCUMENTS

| 5,859,387 A | 1/1999 | Gagnon | |
|---|---|---|---|
| 9,214,607 B1 * | 12/2015 | Andrews | H01L 33/486 |
| 2007/0126020 A1 * | 6/2007 | Lin | H01L 33/486 257/100 |
| 2008/0087902 A1 * | 4/2008 | Lee | H01L 27/153 257/88 |
| 2013/0343067 A1 * | 12/2013 | Okada | H01L 33/62 362/382 |
| 2014/0175472 A1 * | 6/2014 | An | H01L 25/0753 257/91 |
| 2015/0349225 A1 * | 12/2015 | Oh | H01L 33/38 257/99 |

OTHER PUBLICATIONS

Chemical Guide for LED Components, AN Chemical, Version 1.3, Release Date: Aug. 4, 2014, 10 pages.
(Continued)

*Primary Examiner* — Cheung Lee
*Assistant Examiner* — Stephen C Smith
(74) *Attorney, Agent, or Firm* — Volpe and Koenig, P.C.

(57) ABSTRACT

Embodiments of the invention include a package for a light emitting diode (LED). The package includes a lead frame, an LED, and an optically reflective but electrically non-conductive molding. The lead frame has a first lead frame part and a second lead frame part electrically isolated from the first lead frame part, each lead frame part having at least one raised pillar. The molding is disposed over the lead frame except over the pillars of the lead frame. The LED is mounted on at least one pillar and is electrically coupled to at least one pillar. The molding serves the purpose of a highly reflective, electrically conductive material like silver without being subject to tarnishing.

14 Claims, 4 Drawing Sheets

(56) References Cited

OTHER PUBLICATIONS

Exclusive NIchia Mid-Power LED Package Design Advances Lumen and Color Maintenance, NICHI BP-CS14256, 4 pages.
I-Hsin Lin et al., Chemical Compatibility of LEDs, Application Note, Feb. 2015, 24 pages.
Norbert Hafner et al., Preventing LED Failures Caused by Corrosive Materials, Application Note, Jun. 2013, 5 pages.
Hitachi Chemical, "White Epoxy Molding Compounds for LED Reflector, CEL-W Series," http://www.hitachi-chem.co.jp/english/products/other/002.html, Available at: https://web.archive.org/web/20170419131115/http://www.hitachi-chem.co.jp/english/products/other/002.html (Apr. 19, 2017).

\* cited by examiner

LIGHT EMITTING DEVICE INCLUDING A LEAD FRAME AND AN INSULATING MATERIAL

BACKGROUND

Light emitting diodes ("LEDs") are solid state devices that emit light when provided with an electrical current. LEDs are packaged in a relatively complex encasement incorporating different materials to provide various functions for the LED. One component typically used in a package is a layer of silver. The silver provides good electrical conductivity to the LED semiconductor device while also providing good optical characteristics such as high reflectivity and reflectivity of light at appropriate wavelengths. However, silver is subject to tarnishing, even when covered by an encapsulation material.

DETAILED DESCRIPTION

A package is provided herein with physical characteristics that reduce the necessity for the use of silver, which, while having good optical qualities such as reflectivity, is susceptible to being tarnished by environmental agents. More specifically, silver has a high affinity to materials such as hydrogen sulfide, halogens, oxygen, water vapor, nitrous oxide, sulfur dioxide, and ozone, which may be found in polluted air, especially in city centers or industrial areas. These materials may result in the formation of black silver sulfide or dark yellow silver oxide (known as silver tarnish), which may significantly and rapidly reduce the reflectivity of the silver.

The package includes a metal lead frame, a molding material disposed at least partially over the lead frame and forming a well in which light emitting diode ("LED") components are disposed, and an encapsulation material disposed within the well. The metal lead frame includes pillars on which an LED or other components are disposed and/or that serve as electrical contact points to form an electrical circuit that includes the lead frame and components within the well. Areas of the lead frame other than the pillars are covered by the molding, which is optically reflective. The top surface of the molding material within the well is flush with (or approximately flush with) the top surface of the pillars (or the top surface of any additional layers, such as a plated metal layer or the like, formed over the pillars), to form a single flush bottom surface of the well. The molding material is a highly reflective material to reflect light from the LED and provide good optical characteristics for the LED package. The lead frame configuration having raised pillars allows a more conventional material like silver to not be used in the LED package, or to be used less in the LED package, which alleviates the silver tarnishing problem. More specifically, while in conventional designs, silver would cover much of the bottom surface of the well, and thus would be subject to tarnishing, reducing the optical characteristics of the LED package, in the package of the present disclosure, the exposed surface virtually lacks silver, reflectivity being provided by the reflective molding material not subject to silver tarnishing.

Figure 1:
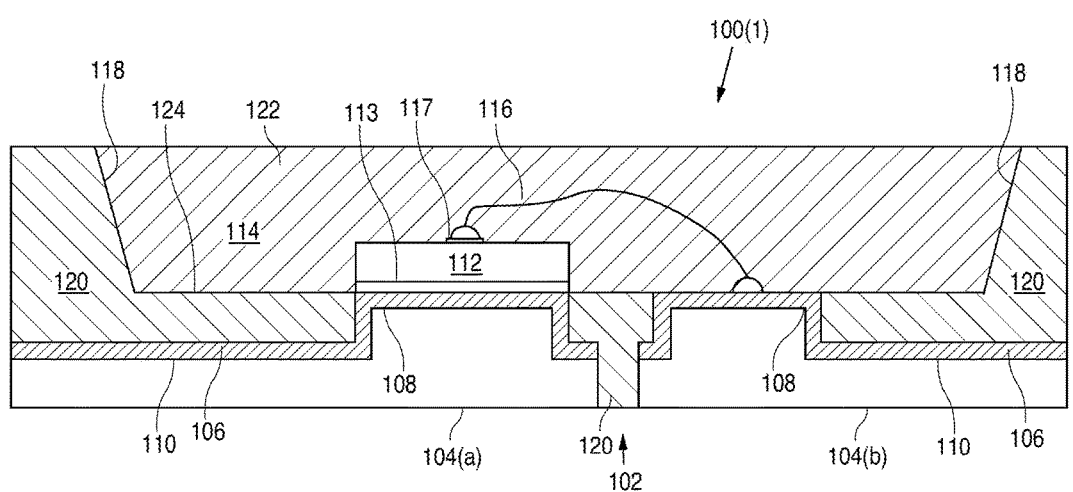
FIG. 1 is a cross sectional view of an LED package, according to an example.

FIG. 1 is a cross sectional view of a package 100(1) according to an example. The package 100 includes a lead frame 102 that includes a first lead frame part 104(a) and a second lead frame part 104(b), the first lead frame part 104(a) being electrically isolated from the second lead frame part 104(b). The different lead frame parts 104 of the lead frame 102 provide electrical coupling between components within the package 100 and components external to the package. For example, one lead frame part 104 may couple to one terminal of an LED device 112 and to one external wire and another lead frame part 104 may couple to another terminal of the LED device 112 and to a different external wire, so that the LED device 112 is integrated into a circuit. A metal plating layer 106 is disposed over the first lead frame part 104(a) and the second lead frame part 104(b) in order to electrically couple various components, such as the LED 112, to the lead frame 102. Though in conventional designs, a plating layer is made of silver so that the plating layer can perform double duty as both electrical conductor and optical reflector, in the present disclosure, the metal plating layer 106 does not need to be silver as the reflectivity of the LED package 100 is provided by the molding material 120. The metal plating layer 106 may be any technically feasible material other than silver, or may be silver.

The lead frame 102 has two raised portions or "pillars" 108 that extend above a lower surface 110 of the lead frame 102. The pillars 108 serve to provide points of electrical contact for electrical components (such as the LED 112) within a well 114. The well 114 is formed by side-walls 118 of a molding 120 made of a molding compound. The LED 112 is disposed on one of the pillars 108 and is electrically coupled, via a wire bond 116, to a pillar 108 of the second lead frame part 104(b). The LED 112 is also electrically coupled, via an electrically conductive contact 113, to the pillar 108 of the first lead frame part 104(a). The pillars 108 allow electrical connections to be formed between components within the well 114 and the lead frame 102 while minimizing the amount of exposed metal disposed, for example, over the lead frame 102. An encapsulant 122 is disposed over the components within the well 114 and fills the space of the well 114.

In a conventional lead frame design, two (or more) electrically isolated parts of a lead frame are plated with a metallic material such as silver which provides both electrical coupling to the lead frame and high optical reflectivity with good color characteristics of reflected light. Silver is very often used as a particularly good electrically conductive and optically reflective material in conventional designs. However, as described above, silver is subject to tarnishing even when covered by an encapsulation material. The lead frame 102 with pillars 108 of the present disclosure provides the function of allowing for electrical connection of components in the well 114 to the lead frame 102 while also allowing most of the bottom-most surface of the well 114 (which bottom-most surface is also called a "basin 124") to be comprised not of silver but instead of a highly optically reflective non-electrically-conductive material. Note, the basin 124 is comprised of the top-most surfaces of the metal layer 106 and of the top-most surface of the molding 120 at the bottom of the well 114. Although illustrated as being a flush surface, the various portions of the basin 124 may be slightly or substantially uneven.

Figure 2:
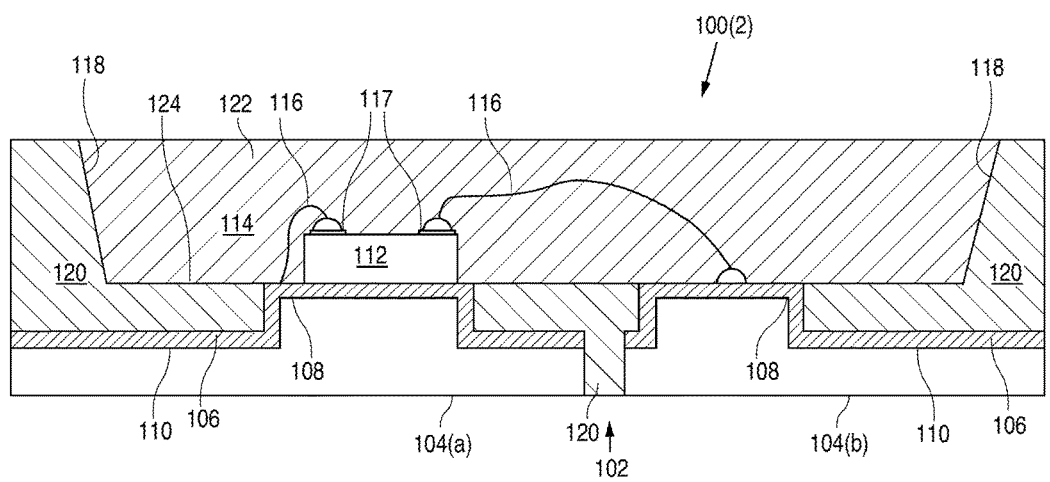
FIGS. 2 and 3 illustrate alternative configurations for the LED package, according to examples.
Figure 3:
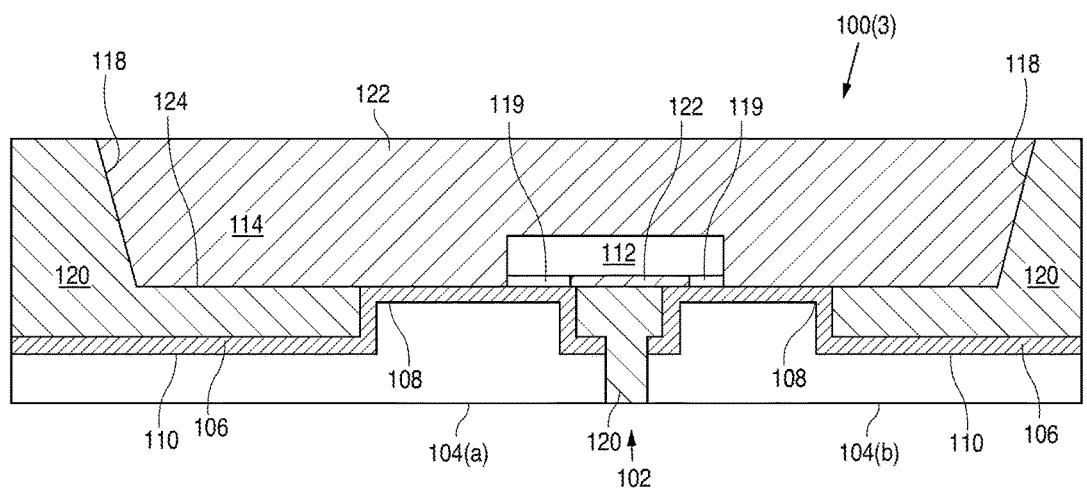

FIGS. 2 and 3 illustrate alternative configurations for the package 100, according to examples. More specifically, FIG. 2 illustrates a package 100(2) in which the LED 112 is coupled to the lead frame 102 via two wire bonds 116 and FIG. 3 illustrates a package 100(3) in which two contacts 119 on the bottom of the LED 112 couple the LED 112 to the lead frame 102. FIG. 2 is a cross-sectional view of a package 100(2) according to another example. The package 100(2) is similar to the package 100(1) except that in the package 100(2), the LED 112 is coupled to the lead frame 102 through two wire bonds 116 (which are coupled to the LED 112 through contacts 117) instead of through a contact 113 on the bottom of the LED 112 and a single wire bond 116. The LED 112 is mounted on to a pillar 108, but has no electrical coupling to the pillar through the bottom surface of the LED 112. FIG. 3 is a cross-sectional view of a package 100(3) according to yet another example. In the package 100(3), the LED 112 is coupled to the lead frame 102 through two contacts 119 and without wire bonds 116. The LED 112 is mounted over both illustrated lead frame parts 104 to allow the two contacts 119 to be coupled to the two lead frame parts 104 while the LED 112 is directly over the two lead frame parts 104.

Although a specific configuration of components within the well 114 is shown, it should be understood that various configurations not illustrated are within the teachings of the present disclosure. The composition of the basin 124 varies depending on the shape, size, and number of pillars 108. In various embodiments, the basin 124 is mostly a non-conductive material, such as the material of the molding 120. In such embodiments, the basin 124 is 50% non-conductive material, 85% non-conductive material, or 95% non-conductive material. The portion of the basin 124 that is not the non-conductive material comprises the conductive material of the lead frame 102 and/or the metal layer 106.

In the example packages 100 illustrated above, the molding 120 comprises a highly reflective material. For example, the molding 120 comprises a silicone molding compound with high thermal, mechanical, electrical, and photochemical stability, such as, but not limited to, thermal set polysiloxane and its derivative compounds. In various embodiments, the molding 120 is formed from an electrically insulating material such as plastic, thermoset material, thermoplastic material, polymer, epoxy polymer resin, composite materials based on silicone, composite molding compound silicone, polycyclohexylene, polycyclohexylene terephthalate, epoxy molding compound, liquid crystal polymers, mixtures thereof, or any other suitable material. The material forming the molding 120 may include fillers such as organic or inorganic materials. The fillers may adjust the physical properties of the material of molding 120 to improve the integrity and reliability of the material under application conditions of the LED device, and to achieve desired optical reflectivity for the molding 120. The material used for the molding 120 is durable, substantially non-yellowing, mechanically suitable, compatible with appropriate manufacturing processes, and highly reflective. Preferably, the molding 120 has a similar coefficient of thermal expansion as the lead frame 102, where "similar" means that the coefficients of thermal expansion are within 10% of each other. Although certain possible materials for the molding 120 are listed above, any suitable material may be used.

The metal plating layer 106 is illustrated disposed over the top surface of the lead frame 102, but in various examples, the metal plating layer 106 is disposed over only a portion of the top surface of the lead frame 102, such as over the pillars 108. Further, the metal plating layer 106 may be any electrically conductive material. In some embodiments, the metal plating 106 and molding 120 that form the basin 124 are both materials that are stable at high temperature, stable at high doses of short wavelength (blue and UV) light, and inert to corrosive gases such as sulfur and/or its compounds, chlorine and/or its compounds, nitrogen oxides, ozone, water vapor, oxygen, and other pollutants in the environment of the intended applications of the LED 112. Although the lead frame 102 in the example packages 100 is illustrated as having a metal layer 106 disposed over the top surface to provide compatibility for wire bond 116 of FIGS. 1 and 2, or contacts 119 in FIG. 3, as well as protection to the base metal of the lead frame 102. In some embodiments, no such metal layer 106 exists, for example, when such compatibility and/or protection is not required.

The lead frame, including the pillars 108, comprises a conductive material. The conductive material may be, for example, a metal such as copper, silver, gold, nickel, palladium, combinations thereof, alloys thereof, multi-layer stacks of the same or different metals, or any other suitable material.

Although a wire bond is illustrated in some embodiments, any suitable arrangement for electrically connecting the LED 112 to the lead frame 102 may be used. For example, metal bridge(s), solder, conductive epoxy, or other suitable connections may be used instead of a wire bond, in any of the packages 100 illustrated.

As described above, in FIGS. 1-3, the molding 120 forms a well 114 in which various components are disposed. In other embodiments, just enough of the material forming the molding 120 is used to structurally secure the relative positions of the lead frame parts 104 without forming the well 114. In other embodiments, the molding 120 forms the well 114 with shallow side walls 118, for example just deep enough to contain the LED 112, wire bond(s) 116 (if present) or other components within the well 114.

An encapsulant 122 is shown disposed within the well 114. In some embodiments, the encapsulant 122 comprises a transparent material that protects the LED 112 and other components within the well 144, such as the wire bond 116 if present. In some embodiments, the encapsulant 122 includes materials such as wavelength converting materials, materials that improve the thermal performance of the encapsulant 122, materials that cause or reduce light scattering, materials that act as filters, or any other suitable materials.

Though an LED 112 is described, in various embodiments, the LED 112 may be replaced with other types of light emitting devices such as laser diodes and semiconductor light emitting devices made from other materials systems such as other III-V materials, III-phosphide, III-arsenide, II-VI materials, ZnO, or Si-based materials may be used. Blue or UV emitting light emitting devices are often combined with one or more wavelength converting materials to produce different colors of light, such that combined light from the light emitting device and the wavelength converting materials appears white or any other color necessary for a given application.

FIGS. 4-8 illustrate a method of forming the package 100(1) of FIG. 1 and also, together, illustrate an exploded view of the package 100(1) of FIG. 1. It should be understood that, for clarity, some components have been omitted from the views illustrated in FIGS. 4-8. For example, the metal layer 106 is not shown.

Figure 4:
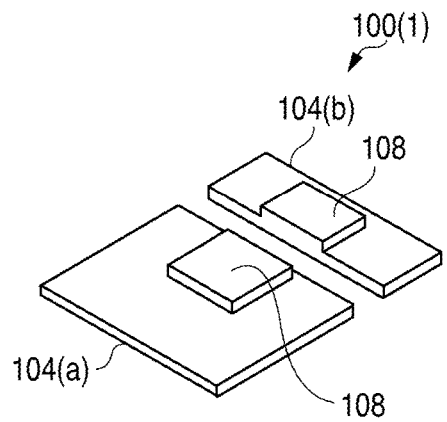
FIGS. 4-8 illustrate an exploded view of, and method of manufacturing, an LED package, according to an example.

In FIG. 4, the lead frame 102 is formed. The posts 108 of the lead frame 102, which are exposed after forming the molding 120, are at a higher elevation than other portions of the lead frame 102, which are covered by the molding 120 when the molding 120 is formed. The lead frame may be formed by, for example, shaping a sheet of metal by molding, folding, stamping, punching, etching, or any other suitable technique. After forming the lead frame 102, a metal layer 106 (not shown) may be formed, for example over the entire surface of lead frame 120, or only certain locations, such as on the portions of the lead frame that are exposed after forming the molding 120. The metal layer 106 may be formed by plating, sputtering, evaporation, or any other suitable technique.

Figure 5:
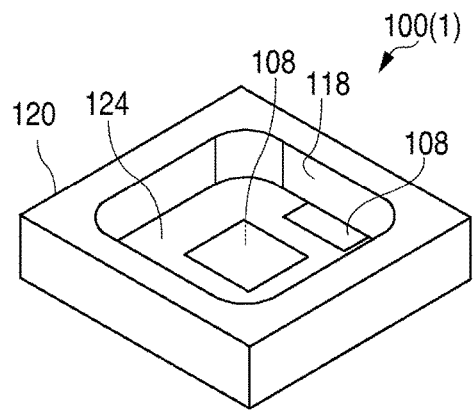

In FIG. 5, the molding 120 is formed on and around the lead frame 120. The molding 120 may be formed by, for example, molding, injection molding, transfer molding, or any other suitable technique. The molding 120 may be shaped to form sidewalls 118 that form a well 114 suitable for enclosing an encapsulant 122, which is formed in FIG. 8, described below. After forming insulator 120, only portions of the lead frame 102 are exposed, such as the pillars 108. Other portions of the lead frame 120 are covered by the molding 120. A majority of the bottom surface ("basin") 124 of the well 114 is covered by the molding 120, rather than the pillars 108. After forming the molding 120, other processing steps may be taken to expose areas (such as the pillars 108) that are not to be covered by the molding 120 in the final device. Suitable processing steps include wet or dry bead blasting, chemical etching, electrolysis, or any other suitable technique to clean the surface of the pillars 108. After such cleaning, other metal layers, such as silver, gold, nickel, palladium, or other suitable materials, may be deposited on the pillars 108.

Figure 6:
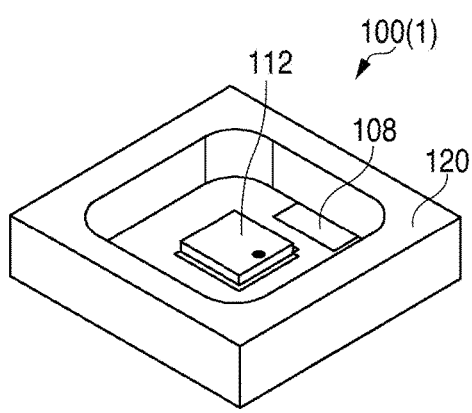

In FIG. 6, LED 112 and any other components, such as an electrostatic discharge protection chip or any other suitable component, are attached to the pillars 108 of the lead frame that are exposed. LED 112 and other components may be attached by, for example, soldering or any other suitable technique.

Figure 7:
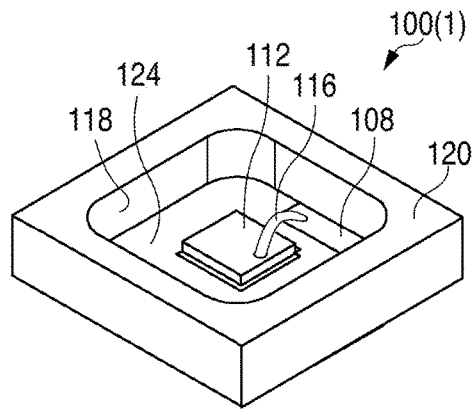
Figure 8:
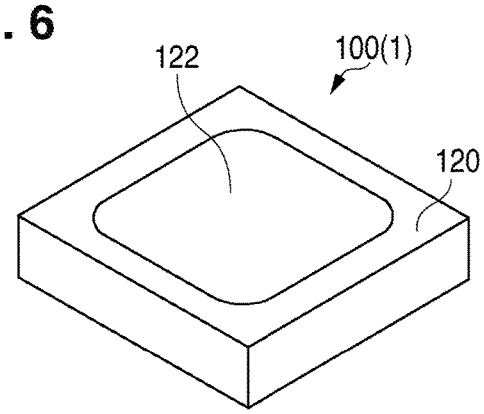

In FIG. 7, one or more wire bonds 116 are formed, if used. Other electrical connections in addition to or as an alternative to wire bonds 116 may be formed, to provide electrical connection between LED 112 and the pillars 108.

In FIG. 7, an encapsulant 122 is disposed in the well 114, covering the LED 112. The encapsulant 122 may be formed by, for example, molding, dispensing, or any other suitable technique. In some embodiments, the encapsulant 122 is disposed in the well 114 in a liquid or gel form, then cured into a solid. The encapsulant 122 may include wavelength converting materials to convert the light emitted by the LED chip to light of other colors. The combination of the light from the LED chip and the light emitted from the wavelength converting materials forms the final color of the light of the LED device.

The devices illustrated in FIGS. 1-8, or any of the devices described above, may be used in any suitable application such as, for example, general lighting, backlighting for displays, or specialized lighting applications. In some embodiments, the devices described above may be incorporated into a mobile phone.

Having described the invention in detail, those skilled in the art will appreciate that, given the present disclosure, modifications may be made to the invention without departing from the spirit of the inventive concept described herein. In particular, different features and components of the different devices described herein may be used in any of the other devices, or features and components may be omitted from any of the devices. A characteristic of a structure described in the context of one embodiment, may be applicable to any embodiment. Therefore, it is not intended that the scope of the invention be limited to the specific embodiments illustrated and described.

What is being claimed is:

1. A light emitting diode ("LED") package, comprising:
   a first portion of a lead frame, the first portion comprising a single first pillar having a first surface and sidewalls;
   a second portion of the lead frame electrically isolated from the first portion, the second portion comprising a second pillar having a second surface and sidewalls;
   a molding comprising an optically reflective and electrically insulating material on the first portion and the second portion, the molding adjacent to the sidewalls of the first pillar and the sidewalls of the second pillar;
   an LED on the first surface;
   a first wire bond electrically coupling the LED to the first surface; and
   a second wire bond electrically coupling the LED to the second surface.

2. The LED package of claim 1, wherein:
   the molding comprises shaped to form a well.

3. The LED package of claim 2, further comprising:
   an encapsulant within the well, the encapsulant configured to physically protect the LED device.

4. The LED package of claim 1, wherein the first pillar has a width that is greater than the width of the LED.

5. The LED package of claim 1, wherein the molding comprises a silicone material.

6. The LED package of claim 1, further comprising:
   a plated metal layer between the lead frame and the molding as well as the LED.

7. The LED package of claim 1, further comprising:
   a plated metal layer between the first pillar and the LED as well as the molding and between the second pillar and the molding.

8. A method of forming a light emitting diode ("LED") package, the method comprising:
   forming a first portion of a lead frame, the first portion including a single first pillar having a first surface and sidewalls;
   forming a second portion of the lead frame electrically isolated from the first portion, the second portion comprising a second pillar having a second surface and sidewalls;
   forming a molding comprising an optically reflective and electrically insulating material on the first portion and the second portion, the molding adjacent to the sidewalls of the first pillar and the sidewalls of the second pillar;
   forming an LED on the first surface;
   forming a wire bond electrically coupling the LED to the first surface; and
   forming a wire bond electrically coupling the LED device to the second surface.

9. The method of claim 8, wherein forming the molding comprises:
   forming sidewalls shaped to form a well.

10. The method of claim 9, further comprising:
    forming an encapsulant within the well, the encapsulant configured to physically protect the LED device.

11. The method of claim 8, wherein the first surface has a width that is greater than the width of the LED device.

12. The method of claim 8, wherein the molding comprises a silicone material.

13. The method of claim 8, further comprising:
    forming a plated metal layer between the lead frame and the molding as well as the LED.

14. The method of claim 8, further comprising:
  forming a plated metal between the first pillar and the LED as well as molding and between the second pillar and the molding.

* * * * *